United States Patent
Chen et al.

(10) Patent No.: US 9,444,002 B2
(45) Date of Patent: Sep. 13, 2016

(54) GRAPHENE TRANSISTOR OPTICAL DETECTOR BASED ON METAMATERIAL STRUCTURE AND APPLICATION THEREOF

(71) Applicant: SUZHOU INSTITUTE OF NANO-TECH AND NANO-BIONICS, CHINESE ACADEMY OF SCIENCES, SIP Suzhou (CN)

(72) Inventors: Qin Chen, SIP Suzhou (CN); Shichao Song, SIP Suzhou (CN)

(73) Assignee: Suzhou Institute of Nano-Tech and Nano-Bionics, Chinese Academy of Sciences, Suzhou (CN)

( * ) Notice: Subject to any disclaimer, the term of this patent is extended or adjusted under 35 U.S.C. 154(b) by 0 days.

(21) Appl. No.: 14/761,907

(22) PCT Filed: Oct. 28, 2013

(86) PCT No.: PCT/CN2013/001294
§ 371 (c)(1),
(2) Date: Jul. 17, 2015

(87) PCT Pub. No.: WO2014/117314
PCT Pub. Date: Aug. 7, 2014

(65) Prior Publication Data
US 2015/0357504 A1  Dec. 10, 2015

(30) Foreign Application Priority Data
Jan. 30, 2013 (CN) .......................... 2013 1 0036555

(51) Int. Cl.
*H01L 29/06* (2006.01)
*H01L 31/113* (2006.01)
(Continued)

(52) U.S. Cl.
CPC ......... *H01L 31/1136* (2013.01); *H01L 27/146* (2013.01); *H01L 29/0847* (2013.01);
(Continued)

(58) Field of Classification Search
CPC ............ H01L 27/146; H01L 29/0847; H01L 29/1606; H01L 29/42372; H01L 31/02162; H01L 31/028; H01L 31/1136
USPC .................... 257/27, 24, 288; 438/99; 435/5
See application file for complete search history.

(56) References Cited

U.S. PATENT DOCUMENTS

| 2008/0251723 | A1* | 10/2008 | Ward | ........................ G01J 5/02 250/338.4 |
| 2011/0147715 | A1* | 6/2011 | Rogers | ................... B82Y 10/00 257/24 |

(Continued)

FOREIGN PATENT DOCUMENTS

| CN | 201010250695.5 | 3/2012 |
| CN | 201210041323.6 | 12/2012 |
| CN | 201310036555.7 | 5/2013 |

OTHER PUBLICATIONS

International Search Report for PCT/CN2013/001294.

*Primary Examiner* — Mohammed Shamsuzzaman
(74) *Attorney, Agent, or Firm* — Wang Law Firm, Inc.

(57) ABSTRACT

A graphene transistor optical detector based on a metamaterial structure and an application thereof. The optical detector includes a substrate, a gate metal layer, a gate medium layer, a graphene layer, a source and drain metal layer successively arranged from bottom to top, wherein a local region of at least the source and drain metal layer has a periodic micro/nanostructure, the periodic micro/nanostructure being matched with the gate metal layer and the gate medium layer to form a metamaterial structure having a complete absorption characteristic. By changing the refractive index, thickness or the like of material for the periodic micro/nanostructure and the gate medium layer, a light absorption frequency band of the metamaterial structure can be regulated. The optical detector provided by the present invention has higher flexibility and narrow-band response, and can work under visible light to infrared even longer wavebands by selecting different metamaterial structures.

7 Claims, 10 Drawing Sheets

(51) Int. Cl.
*H01L 31/028* (2006.01)
*H01L 29/16* (2006.01)
*H01L 29/08* (2006.01)
*H01L 29/423* (2006.01)
*H01L 31/0216* (2014.01)
*H01L 27/146* (2006.01)

(52) U.S. Cl.
CPC ..... *H01L29/1606* (2013.01); *H01L 29/42372* (2013.01); *H01L 31/028* (2013.01); *H01L 31/02162* (2013.01)

(56) References Cited

U.S. PATENT DOCUMENTS

| | | | |
|---|---|---|---|
| 2012/0056161 A1* | 3/2012 | Avouris | H01L 29/1606 257/24 |
| 2012/0282594 A1* | 11/2012 | Chen | G01N 27/4146 435/5 |
| 2015/0129941 A1* | 5/2015 | Zhang | H01L 27/3274 257/288 |

* cited by examiner

GRAPHENE TRANSISTOR OPTICAL DETECTOR BASED ON METAMATERIAL STRUCTURE AND APPLICATION THEREOF

TECHNICAL FIELD OF THE INVENTION

The present invention relates to an optical detection device, in particular to an absorption-enhanced graphene field effect transistor optical detector based on a micro/nanostructure and an imaging application thereof.

BACKGROUND OF THE INVENTION

Graphene is a two-dimensional layered material structure of carbon. The single-layer graphite has a thickness of about 0.35 nm and has outstanding electrical, optical and mechanical characteristics. Graphite of not more than ten layers is regarded as graphene. Since the successful development of single-layer graphene in 2004, graphene has drawn great attention. Due to its Dirac-Fermi property, linear energy band structure and the highest carrier mobility (200000 $cm^2$ $v^{-1}$ $s^{-1}$) among the materials that have been discovered so far, graphene has been widely applied in the field of high-frequency nano-electronic devices. Meanwhile, graphene has remarkable optical characteristics and a flat absorption band from ultraviolet, visible light to infrared bands (from 300 nm to 6 μm); and, its absorption characteristic may be regulated by applying a voltage (Science, Vol. 320, P206), so that graphene may realize wideband high-speed photoelectric conversion. Graphene shows very high interaction with light, so that the absorption of the single-layer graphene (0.34 nm in thickness) in the above wavebands amazingly reaches 2.3% (Physical Review Letters, Vol. 01, P196405; Science, Vol. 320, P1308). However, the effective absorption of single-layer or multi-layer (less than 10 layers) graphene to light is far lower than the efficiency of other bulk materials or quantum well structures.

Recently, more and more researches have focused on the enhancement of the interaction between graphene and light, particularly on light absorption. In 2012, the team of Prof. Mueller in Australia proposed that graphene was placed between two one-dimensional Bragg grating reflectors to enhance the interaction between the graphene and near-infrared light by increasing the photon state density via a microcavity. In comparison to a case without any microcavity, it was found that light absorption was enhanced by 26 times (Nano Letters, Vol. 12, P2773). Meanwhile, in P3808 in the same volume of Nano Letters, another technology for enhancing light absorption by the surface plasmon effect of a metal nanostructure was disclosed, and the experimental results showed that light current in the visible light waveband was increased by 8 times. In 2012, a team of the United States, the United Kingdom and Germany proposed to use a metal microcavity in combination with a transistor structure to improve the sensitivity of a graphene optical detector, and it was found that the light current in the visible light waveband was increased by 20 times (Nature Communications, Vol. 3, P906). In addition, in 2011, using a graphene transistor, scientists in the United States observed the absorption phenomena of THz waves caused by two-dimensional electron gas (Nature Nanotechnology, Vol. 6, P630). As can be seen, detectors based on graphene have shown an ultra-wide working range from visible light to THz waves. Although the above technologies all show a certain degree of enhancement of light absorption of graphene by microcavity, plasmon or other effects, more effective technical solutions need to be further explored in the art due to the complexity of technical processes and the limitations to the performance enhancement.

SUMMARY OF THE INVENTION

In view of the deficiencies of the prior art, a main object of the present invention is to provide a graphene transistor optical detector based on a metamaterial structure, including a substrate, a gate metal layer, a gate medium layer, a graphene layer, a source and drain metal layer successively arranged from bottom to top, wherein a local area of at least the source and drain metal layer has a periodic micro/nanostructure, the periodic micro/nanostructure being matched with the gate metal layer and the gate medium layer to form a metamaterial structure having an approximately complete absorption characteristic.

Further, the impedance Z of the metamaterial structure is equal to or approximate to a vacuum impedance of 376.7Ω, wherein $Z=(\mu/\in)^{1/2}$, where $\in$ and μ denote a dielectric constant and a magnetic permeability of the metamaterial structure, respectively.

Further, a lower end face of the source and drain metal layer comes into contact with the graphene layer to form a conductive channel for connecting a source and a drain of the transistor.

The source and drain metal layer comprises a source and a drain, wherein local regions of at least the source and the drain are staggered to form a periodic micro/nanostructure.

As one of preferred embodiments, the thickness of the source and drain metal layer is 20-200 nm.

As one of preferred embodiments, the thickness of the gate metal layer should be enough to completely prevent light transmission, particularly, preferably above 50 nm.

The graphene layer includes single-layer graphene, multi-layer (not more than 10 layers) graphene or a graphene micro/nanostructure layer.

The gate medium layer is made of low-light-absorption dielectric material which, for example, may be selected from but not limited to silicon oxide, silicon nitride, aluminum oxide or the like.

The graphene layer is selected from single-layer graphene, multi-layer (less than or equal to 10 layers) graphene or a graphene micro/nanostructure layer.

Another object of the present invention is to provide an application of the above-mentioned graphene transistor optical detector based on a metamaterial structure in a spectrum detecting and analyzing device or an image sensing device.

Yet another object of the present invention is to provide an image sensing device or a spectrum detecting and analyzing device, including a plurality of the above-mentioned graphene transistor optical detectors based on a metamaterial structure, which are distributed in an array.

Compared with the prior art, the present invention at least has the following advantages:

by integrating the graphene layer in the metamaterial structure having an approximately complete absorption characteristic, the absorption of graphene to light, i.e., the sensitivity of the detector, is improved;

meanwhile, due to a specific structure of the metamaterial, by using two metal layers as a gate, a source and a drain of a transistor structure, respectively, and sandwiching the graphene layer as a conductive channel between the two metal layers, the metamaterial structure may be combined with the transistor structure to form a high-speed transistor detector;

in addition, the multi-layer graphene in the graphene layer has an adjustable band gap and provides for absorption in visible light, infrared and even longer wavebands, and the metamaterial structure also has an adjustable working waveband, so ultra-wideband high-speed and high-sensitivity graphene transistor optical detector may be obtained by optimization; furthermore, by integrating optical detectors working in different wavebands, a monolithic wideband optical detection array having a multi-waveband imaging ability may be formed.

BRIEF DESCRIPTION OF THE DRAWINGS

The content of the present invention will be further explained as below with reference to the accompanying drawings. However, the following drawings are merely schematic diagrams of ideal embodiments of the present invention. To clearly show the structure of a device involved herein, the thickness of selected layers and regions is properly enlarged. The schematic diagrams should not be regarded as strictly reflecting the geometric scale. In addition, the embodiments described in the present invention should not be regarded as limited to specific shapes of the regions shown in the drawings. In general, the following drawings are illustrative and not intended to limit the scope of the present invention.

DETAILED DESCRIPTION OF THE INVENTION

Figure 1:
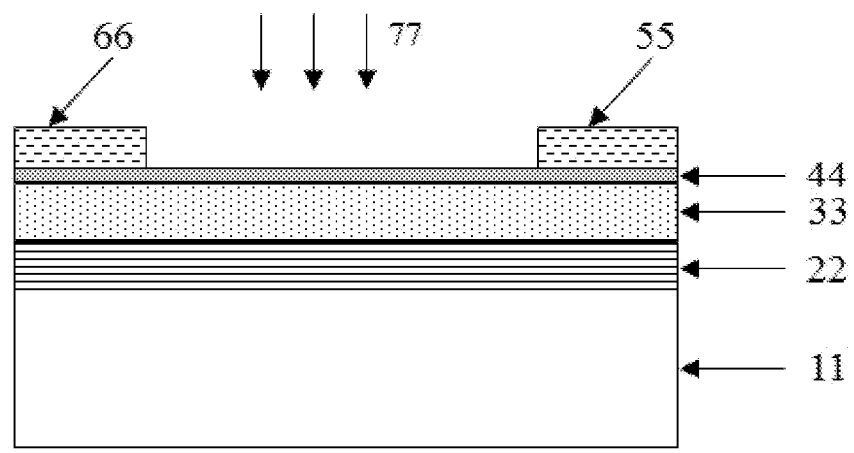
FIG. 1 is a longitudinally sectional view of a graphene transistor optical detector based on a metamaterial structure according to an alternative embodiment of the present invention.

One aspect of the present invention is to provide a graphene transistor optical detector based on a metamaterial structure, which may has a field effect transistor structure and may include a gate metal layer, a gate medium layer, a graphene layer and a source and drain metal layer successively formed on a substrate from bottom to top, wherein a partial structure of the source and drain metal layer forms a periodic metal micro/nanostructure and, together with the gate metal layer and the gate medium layer, forms a metamaterial structure having an approximately near-complete absorption characteristic.

When in use of the graphene transistor optical detector, the period of the periodic micro/nanostructure should be less than a working wavelength of the optical detector to ensure the characteristic of the metamaterial structure. However, the form of a periodic unit of the periodic micro/nanostructure is not limited and may be designed according to actual application requirements.

The substrate may be selected from, but not limited to, a silicon wafer, glass, plastic, stainless or other hard or flexible substrates for supporting the graphene transistor structure.

The gate metal layer may be a layer of continuous metal film, the material of which may be selected from, but not limited to, gold, silver, copper, aluminum, platinum, titanium and the like, and the thickness of which is preferably above 50 nm, particularly 50 nm to 300 nm.

The gate medium layer is preferably made of low-light-absorption dielectric material (for example, in a visible light waveband), for example, including but not limited to silicon oxide, silicon nitride, aluminum oxide and the like.

The graphene layer may be graphene of less than 10 layers or a graphene micro/nanostructure. The graphene layer is located on the gate metal layer and the gate medium layer and comes into contact with a lower surface of the source and drain metal layer to form a conductive channel between a source and a drain.

The source and drain metal layer may be selected from, but not limited to, a single-metal layer such as gold, silver, copper, aluminum, platinum and titanium, an alloy layer or a stacked structure of a plurality of single-metal layers or alloy layers, preferably with a thickness of 20-200 nm.

As one of preferred embodiments, local regions of at least the source and the drain are staggered to form a periodic micro/nanostructure.

The gate metal layer, the gate medium layer and the source and drain metal layer together form a metamaterial structure having an approximately complete absorption characteristic. Further, by regulating the refractive index and thickness of the gate medium layer and the periodic structure and thickness of the source and the drain, the metamaterial structure having an approximately complete absorption characteristic that works in different wavebands may be optimized. For example, as one of preferred application solutions, the dielectric constant $\in$ and magnetic permeability $\mu$ of the metamaterial structure may be optimized by an electromagnetic field numerical analysis method so that the impedance $Z=(\mu/\in)^{1/2}$ of the metamaterial structure is allowed to equal to or approximate to 376.7Ω, thereby achieving the impedance matching of the surface, suppressing the reflection loss and realizing nearly 100% complete light trapping effect.

The graphene layer is located in the metamaterial structure but very thin (<5 nm). Thus, the electromagnetic properties of the metamaterial structure will not be influenced.

By regulating the absorption band of the metamaterial structure, an ultrahigh-sensitivity and high-speed optical detector working in different wavebands may be formed.

During the operation of the graphene transistor optical detector based on a metamaterial structure, the incident electromagnetic wave is interacted with the metamaterial structure and completely restricted in the metamaterial structure. Accordingly, the interaction between the incident electromagnetic wave and the graphene layer is greatly increased and the absorption of the graphene layer to the incident electromagnetic wave is thus greatly improved.

Moreover, as the contact of the source with the drain changes the Fermi energy level of the graphene beneath, a built-in electric field is allowed to form by the graphene and the graphene channel; furthermore, the periodic micro/nanostructure of the source and drain metal layer is arranged in a staggered manner, so that photon-generated carriers may flow to the source and the drain in the conductive channel of the graphene layer very quickly even without source/drain bias. The whole process improves the photoelectric conversion efficiency of the graphene transistor optical detector. If a proper voltage is applied between the source and the drain, the photoelectrical response will be further improved.

As graphene has uniform light absorption in visible light to infrared even longer wavebands, the graphene transistor optical detector provided by the present invention may be optimized to work in visible light to infrared even longer wavebands.

As optical detectors working in different wavebands share a same material and device design, the optical detectors working in different wavebands may be integrated to form a monolithic wideband optical detection array having a multi-waveband imaging ability. On that account, another aspect of the present invention is to provide an imaging application of the graphene transistor optical detector based on a metamaterial structure. The principle will be further described below.

As the graphene has an absorption characteristic from visible light to THz wavebands and as the absorption band of the metamaterial structure may be regulated from visible light to THz wavebands by optimizing structural parameters, graphene transistors or optical detectors which have different metamaterial structures and work in different wavebands may be integrated into an array to realize a monolithic wide-spectrum spectral analysis ability; also, detectors working in different wavebands, for example, visible light color image sensors, may be integrated to form a pixel, and this pixel is then periodically arranged to form a multi-waveband image sensor.

Furthermore, another aspect of the present invention is to provide a method for fabricating the graphene transistor optical detector based on a metamaterial structure. As one of available embodiments, the method may include the following steps of:

(1) fabricating a gate metal layer on a substrate by metal film deposition;
(2) fabricating a gate medium layer on the gate metal layer by film deposition;
(3) fabricating a graphene layer on the gate medium layer by vapor deposition, mechanical stripping, redox, solvent stripping or solvothermal method in conjunction with a substrate transfer technology; and
(4) fabricating source and drain windows, connected by a graphene conductive channel, on the graphene layer by exposure and developing, and then fabricating a source and drain metal layer by stripping and metal film deposition.

In conclusion, the present invention mainly has the following characteristics:

first, the graphene transistor optical detector employs a transistor structure and uses graphene as a conductive channel to realize the ultra-fast collection of photon-generated carries, and utilizes the ultra-wideband light absorption of graphene to realize the monolithic wideband light detection ability;

second, by optimizing the transistor structure, the periodic micro/nanostructure structure of the source and drain metal layer, the gate medium layer and the gate metal layer together form a metamaterial structure having an approximately complete absorption characteristic, so that the light absorption efficiency of the graphene layer located in the metamaterial structure is improved, and the working frequency of the metamaterial structure may be optimized to work in an ultra-wide waveband from visible light to THz.

Combining the above two points, the graphene transistor optical detector provided by the present invention is expected to show characteristics of high speed, high bandwidth and high sensitivity; meanwhile, by integrating graphene transistors or optical detectors which have different metamaterial structures and work in different wavebands into a super pixel and periodically arranging this super pixel to form an image sensor array, the monolithic multi-waveband imaging ability may be realized.

The technical solutions of the present invention will be described in details below by preferred embodiments and the accompanying drawings.

Embodiment 1

Figure 2:
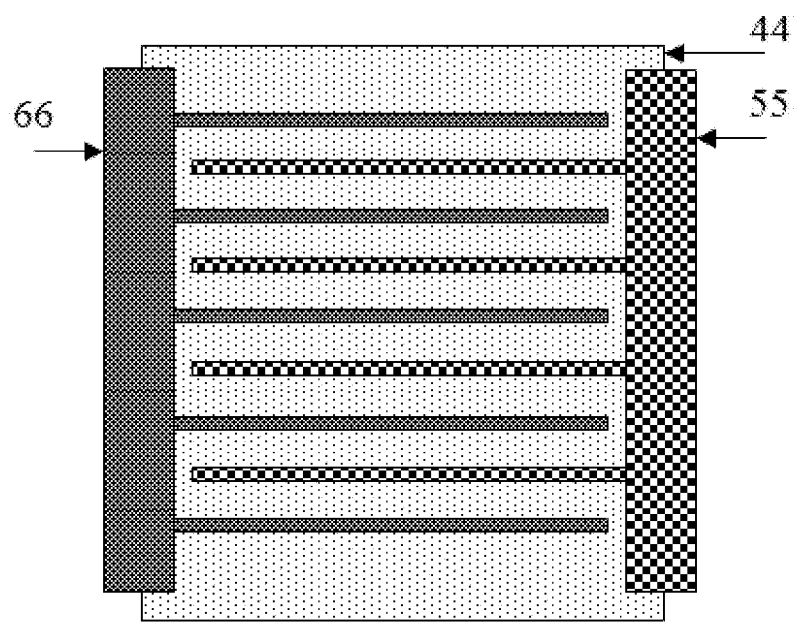
FIG. 2 is a top view of a graphene transistor optical detector based on a metamaterial structure according to an alternative embodiment of the present invention.

Referring to FIG. 1, a longitudinally sectional view of the graphene transistor optical detector based on a metamaterial structure provided in this embodiment is shown. The detector includes a substrate 11, a gate metal layer 22, a gate medium layer 33, a graphene layer 44 and a source metal layer 55 (source) and drain metal layer 66 (drain). In FIG. 1, the incident light is indicated by arrow 77. In this embodiment, the gate metal layer 22 forms a reflective layer of the metamaterial, and the source metal layer 55 and drain metal layer 66 form a surface impedance matching layer of the metamaterial. By optimizing the gate medium layer 33 and a periodic structure of a source metal layer 55 and a drain metal layer 66, approximately complete absorption in a preset waveband may be obtained. Meanwhile, the gate metal layer 22 may be used as a gate of a transistor for regulating the band gap of the graphene layer 44 and forming a carrier conductive channel, thereby realizing photoelectrical conversion. In this embodiment, by integrating the graphene layer into the metamaterial structure, the interaction between the incident light and the graphene, i.e., the photoelectrical conversion efficiency, is improved. Due to the compatibility of the metamaterial with the transistor structure, it is ensured that photon-generated carriers may be quickly separated by the field effect transistor so as to realize the conversion from an optical signal to an electrical signal. As shown in FIG. 2, a top view of the graphene transistor optical detector based on a metamaterial structure is shown. The detector includes a graphene layer 44, a source metal layer 55 and a drain metal layer 66. As can be seen, the graphene layer 44 forms a connection, thus forming a conductive channel, between the source metal layer 55 and the drain metal layer 66; and the source metal layer 55 and the drain metal layer 66 form an one-dimensional periodic structure which is advantageous for the collection of photon-generated carriers and meanwhile form a surface impedance matching layer of the metamaterial, thereby resulting in near-zero reflection to the incident light having a polarization direction vertical to the one-dimensional grating structure, and further improving the photoelectrical conversion efficiency of the detector.

Figure 6:
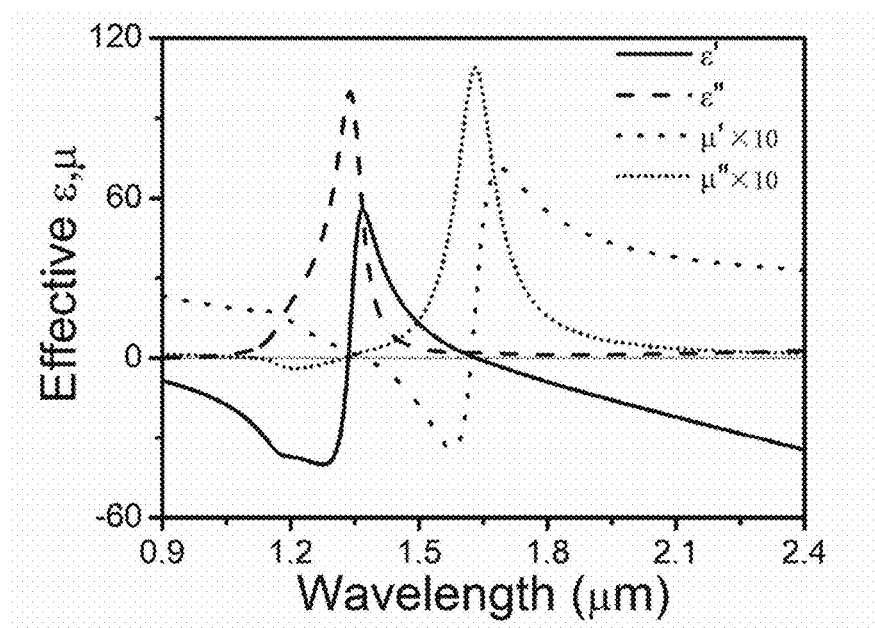
FIG. 6 shows an effective dielectric constant and an effective magnetic permeability of a graphene transistor optical detector based on a metamaterial structure according to Embodiment 1 of the present invention.
Figure 7:
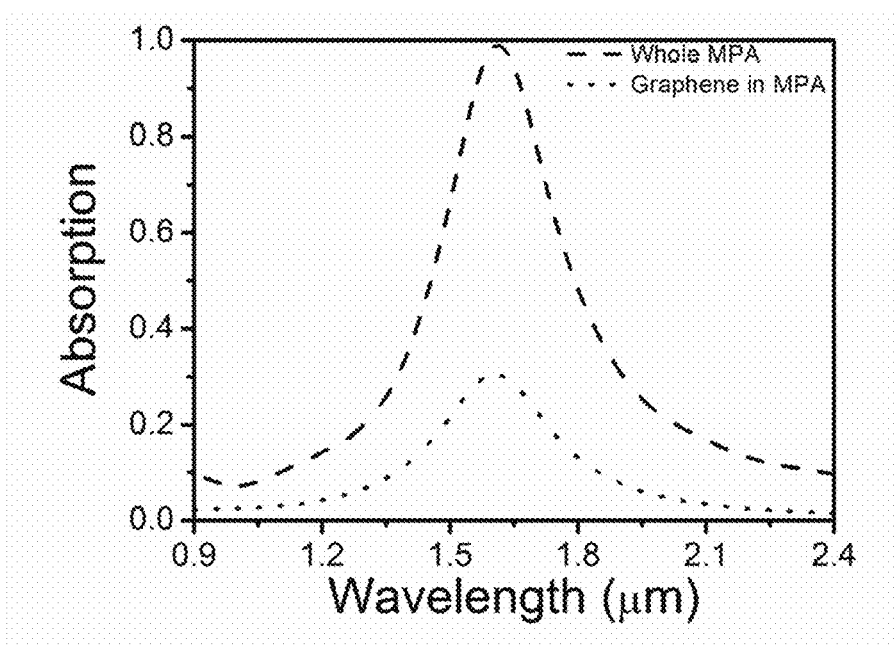
FIG. 7 is an absorption spectrogram of a graphene transistor optical detector based on a metamaterial structure according to Embodiment 1 of the present invention.

In this embodiment, the following specific materials and structures may be selected, wherein the gate material layer 22 is made of gold and has a thickness of at least 50 nm; the gate medium layer 33 is made of aluminum oxide ($Al_2O_3$) and has a thickness of 10 nm; the source metal layer 55 and the drain metal layer 66 are both made of gold and each has a thickness of 70 nm; the periodic metal micro/nanostructure formed by a partial structure of the source metal layer 55 and drain metal layer 66 has a width of 170 nm and a period of 300 nm; and, the TM incident polarized light is indicated by arrow 77, that is, the magnetic field direction of the incident light is parallel to the periodic metal micro/nanostructure formed by the source metal layer 55 and the drain metal layer 66. The effective dielectric constant and effective magnetic permeability of the metamaterial structure in this embodiment are as shown in FIG. 6. At 1.605 μm, the impedance of the whole metamaterial structure is 388.0Ω, which is very approximate to an optimal value. The absorption spectrums of the graphene layer (dotted line) and the whole device structure (dashed line) are as shown in FIG. 7. As can be seen, at 1.605 μm, the absorption of the whole metamaterial structure is approximately 100%, while the absorption of the graphene is more than 30%, which is far higher than the absorption 2.3% of single-layer graphene without any metamaterial structure. It is proved that the light absorption efficiency of the structure provided by the present invention is greatly improved, and the photoelectrical efficiency of the optical detector is thus improved.

Embodiment 2

Figure 3:
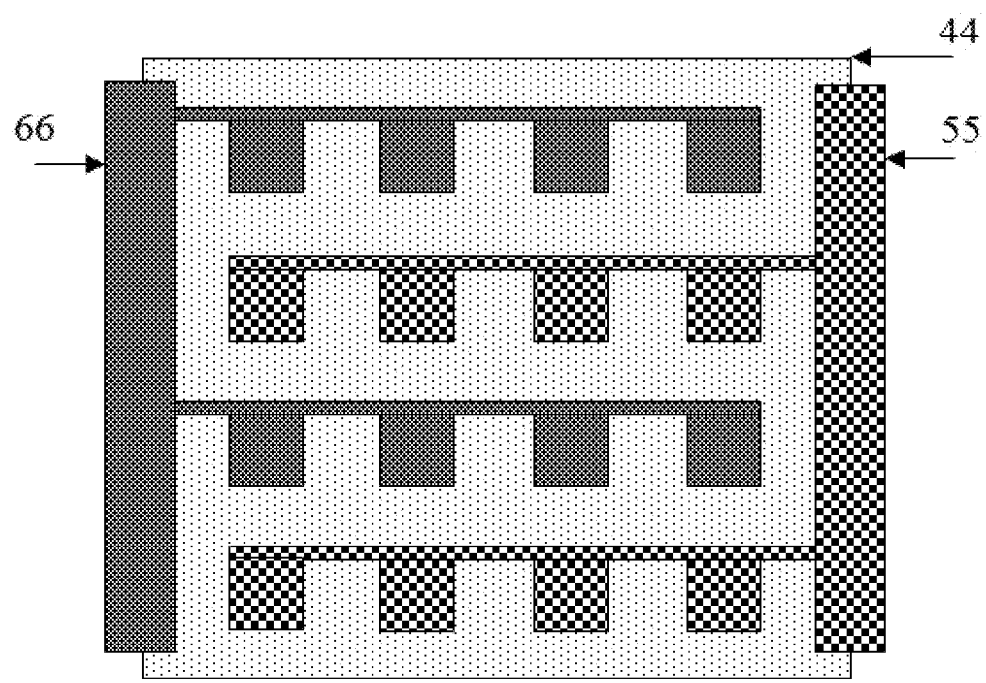
FIG. 3 is a top view of a graphene transistor optical detector based on a metamaterial structure according to another alternative embodiment of the present invention.

The longitudinally sectional view of this embodiment may refer to FIG. 1, and the top view thereof may refer to FIG. 3. A difference between this embodiment and Embodiment 1 mainly lies in that, the source metal layer 55 and the drain metal layer 66 in this embodiment form a two-dimensional structure, and the surface impedance matching layer of the resulting metamaterial may result in near-zero reflection to incident light in different polarization directions, so that the photoelectrical efficiency of the detector is further improved.

Figure 8:
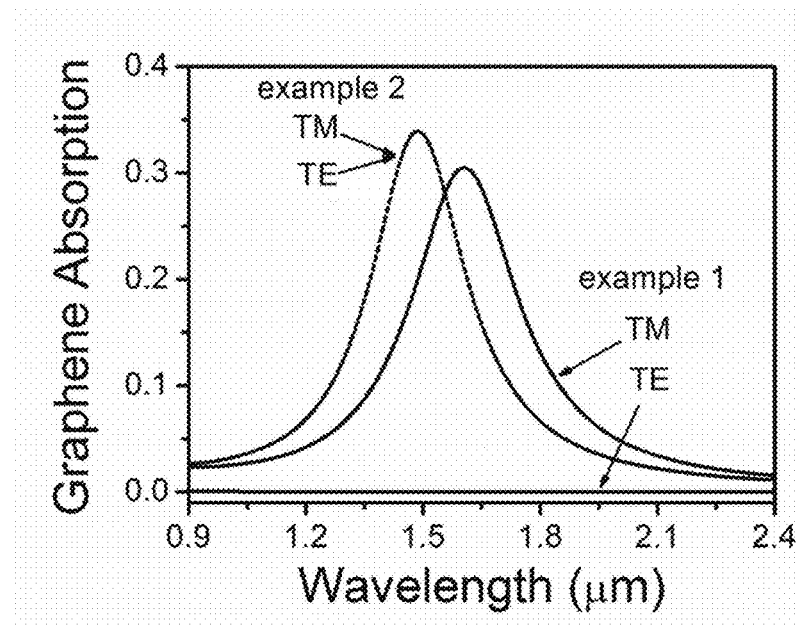
FIG. 8 is an absorption spectrogram of a graphene transistor optical detector based on a metamaterial structure under different polarized light conditions according to Embodiment 2 of the present invention.

In this embodiment, the following specific materials and structures may be selected, wherein the gate material layer 22 is made of gold and has a thickness of at last 50 nm; the gate medium layer 33 is made of aluminum oxide ($Al_2O_3$) and has a thickness of 10 nm; the source metal layer 55 and the drain metal layer 66 are both made of gold and each have a thickness of 70 nm; and, the periodic micro/nanostructure formed by a partial structure of the source and drain metal layer layers has a side length of 170 nm and a period of 300 nm. The absorption rates in this embodiment under different polarization conditions are as shown in FIG. 8 (curve example 2), where the contrast curve Example 1 is an absorption spectrogram of Embodiment 1 under the same polarization conditions as Embodiment 2. As can be seen, the absorption of example 1 has very obvious polarization dependence, while Example 2 has polarization independence because it is a two-dimensional structure, that is, the absorption rates to electromagnetic waves in different polarization directions are the same.

Embodiment 3

Figure 4:
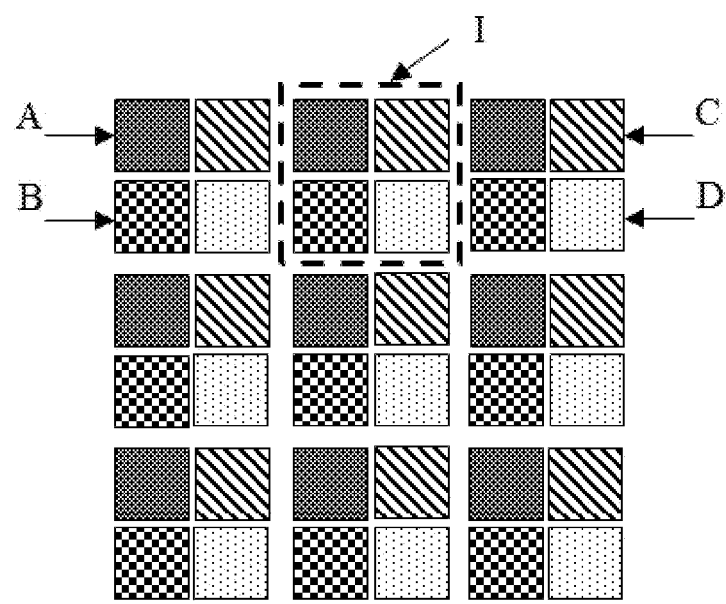
FIG. 4 is a top view of an alternative embodiment of a graphene transistor optical detector based on a metamaterial structure during imaging application according to the present invention.

Referring to FIG. 4, a top view of graphene transistor optical detectors based on metamaterial structures during imaging application according to this embodiment is shown, where A, B, C and D denote graphene transistor detectors working in different preset wavebands, respectively, and the structure of each of these graphene transistor optical detectors may be any one of Embodiment 1 and Embodiment 2. By integrating the detectors A, B, C and D into a pixel I and periodically arranging this pixel to form a whole image sensor, multi-waveband imaging may be realized. For example, A and D are graphene transistor optical detectors working in blue and red wavebands while B and C are graphene transistor optical detectors working in a green waveband, then, an image sensor similar to a RGB (red, green, blue) color image sensor is formed. By optimizing various integration solutions of the graphene transistor detectors working in different wavebands, a multi-waveband super camera may be obtained.

Figure 9:
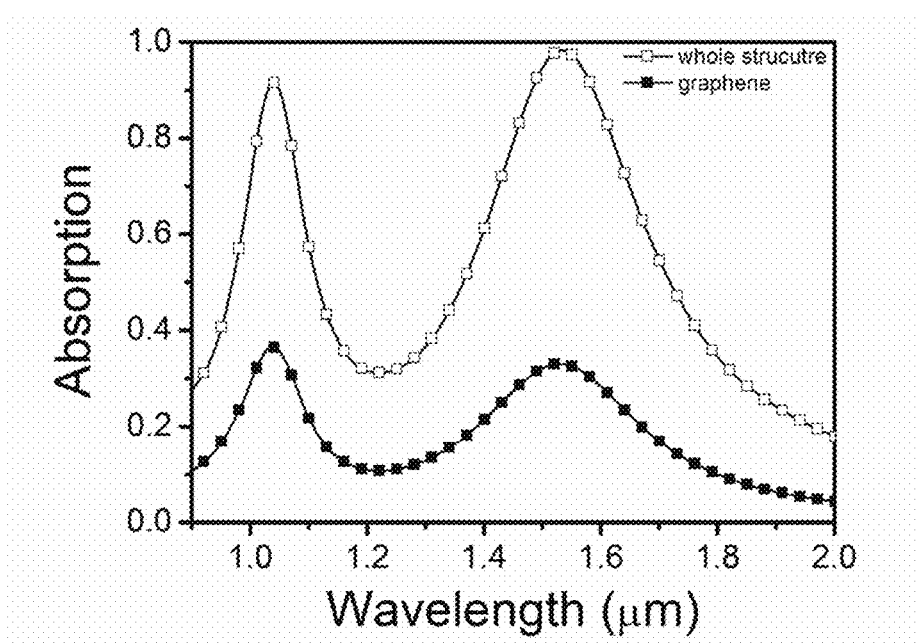
FIG. 9 is an absorption spectrogram of yet another graphene transistor optical detector based on a metamaterial structure according to Embodiment 3 of the present invention.

The longitudinally sectional view of the detectors in this embodiment may refer to FIG. 1, and for each of the detectors, the following specific materials and structures may be selected. The structure includes a substrate 11, a gate metal layer 22, a gate medium layer 33, a graphene layer 44, a source metal layer 55 and a drain metal layer 66, wherein the gate metal layer 22 is made of gold and has a thickness of at least 50 nm; the gate medium layer 33 is made of aluminum oxide ($Al_2O_3$) and has a thickness of 10 nm; the source metal layer 55 and the drain metal layer 66 are both made of gold and each have a thickness of 70 nm; each of the two-dimensional metal micro/nanostructures of the source metal layer 55 and the drain metal layer 66 has a period of 300 nm; the two-dimensional metal micro/nanostructure in the source metal layer 55 has a side length of 170 nm; and the two-dimensional metal micro/nanostructure in the drain 66 has a side length of 110 nm. FIG. 9 is an absorption spectrogram of the whole structure (hollow) and the graphene layer (solid) in this embodiment. As shown in FIG. 9, different resonance peak wavelengths correspond to different periodic structures, where the resonance peak at 1.308 μm corresponds to a two-dimensional periodic structure having a side length of 110 nm, and the resonance peak at 1.533 μm corresponds to a two-dimensional periodic structure having a side length of 170 nm. Therefore, light absorption and optical detection of multiple wavebands may be obtained by such an integration method, so that the multi-waveband imaging may be finally realized.

Embodiment 4

Figure 5:
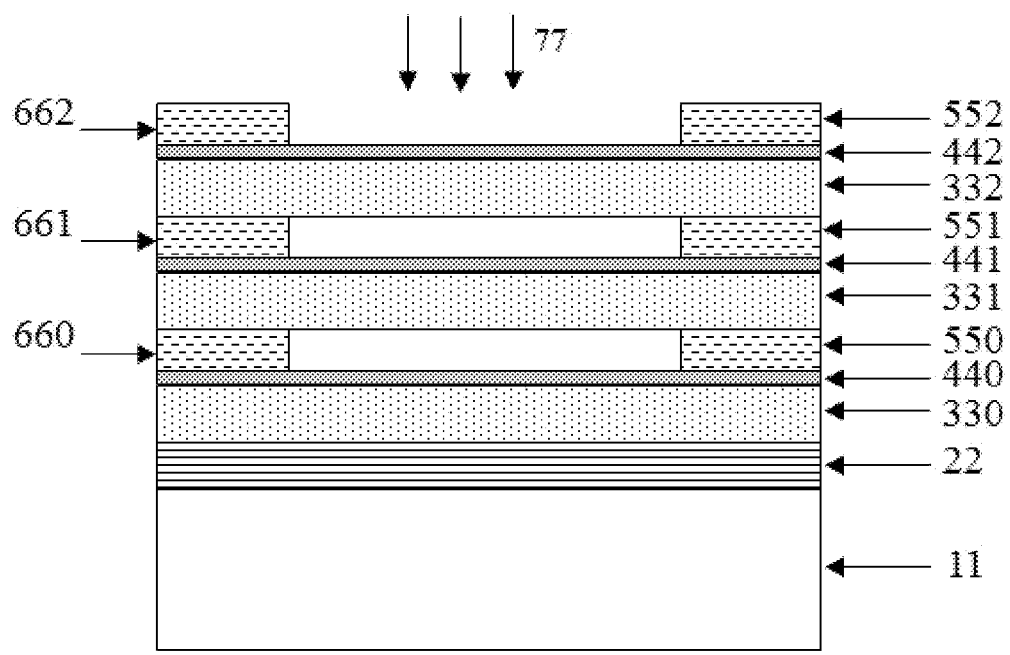
FIG. 5 is a longitudinally sectional view of another alternative embodiment of a graphene transistor optical detector based on a metamaterial structure during imaging application according to the present invention.

Referring to FIG. 5, a longitudinally sectional view of a graphene transistor optical detector based on a metamaterial structure during imaging application according to this embodiment is shown. The source and gate structure layer may refer to FIG. 2. The optical detector includes a substrate 11, a gate metal layer 22, gate medium layers 330, 331 and 332, graphene layers 440, 441 and 441, source metal layers 550, 551 and 552 and drain metal layers 660, 661 and 662. The incident light is indicated by arrow 77. Different from the integration of graphene optical detectors working in different wavebands within a plane in Embodiment 3, in this embodiment, metamaterial structures in different wavebands are cascaded in a direction vertical to the graphene layers to form a multi-waveband graphene optical detector, so that the incident light 77 in different wavebands is subjected to photoelectrical conversion on different graphene layers 440, 441 and 442, so as to acquire spectral information of different wavebands, thereby realizing color imaging in a visible light waveband or spectral imaging within a wide spectrum range. In this embodiment, as it is not required to integrate graphene optical detectors working in different wavebands in a plane, the space within the plane is saved and the spatial resolution is improved.

Figure 10:
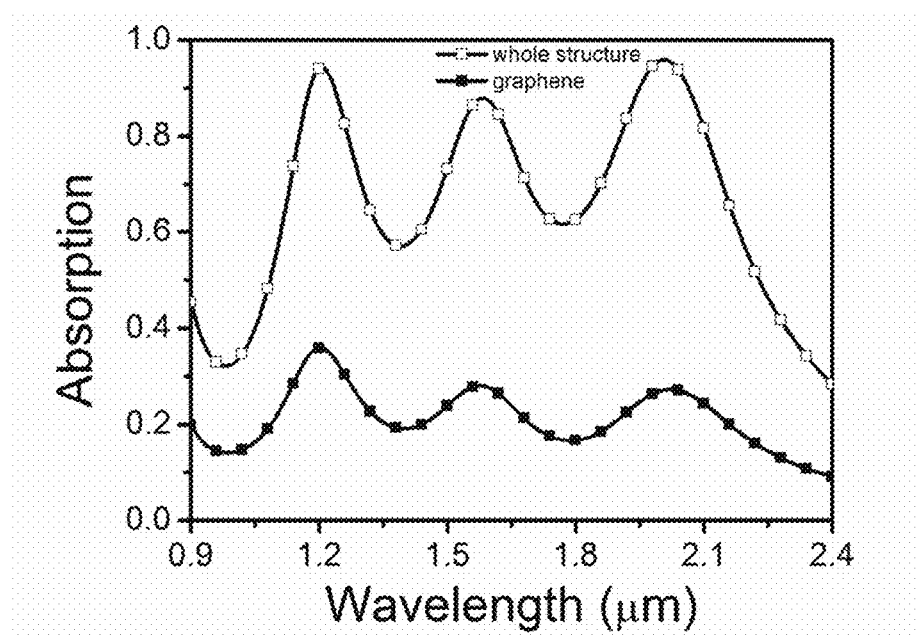
FIG. 10 is an absorption spectrogram of still another graphene transistor optical detector based on a metamaterial structure according to Embodiment 4 of the present invention.

In this embodiment, the following specific materials and structures may be selected, wherein the gate metal layer 22 is made of gold and has a thickness of at least 50 nm; the gate medium layers 330, 331 and 332 are made of aluminum oxide ($Al_2O_3$) and have a thickness of 6 nm, 8 nm and 10 nm, respectively; the source metal layers 550, 551 and 552 have a thickness of 20 nm, 30 nm and 40 nm, respectively; the drain metal layers 660, 661 and 662 have a thickness of 20 nm, 30 nm and 40 nm, respectively; and, each of the metal micro/nanostructures of the source metal layers 55 and the drain metal layers 66 has a period of 300 nm. The graphene layers 440, 441 and 442 are located between the gate medium layer 330 and the source metal layer 550 and drain metal layer 660, between the medium layer 331 and the source metal layer 551 and drain metal layer 661, and between the medium layer 332 and the source metal layer 552 and drain metal layer 662, respectively. The TM incident polarized light is indicated by arrow 77. FIG. 10 is an absorption spectrogram of the whole structure (hollow) and a graphene layer (solid) of this embodiment. As shown in FIG. 10, there are totally three resonance peaks, i.e., 1.203 μm, 1.578 μm and 2.022 μm, respectively. By designing a cascaded structure vertical to the direction of the graphene layer, multi-waveband light absorption may be realized so that spectral information of multiple wavebands may be obtained.

It is to be noted that, the forgoing embodiments are merely provided for describing the technical concepts and features of the present invention in order to make those skilled in the art able to understand the content of the present invention and able to thus implement the present invention, and are not intended to limit the protection scope of the present invention. Any equivalent changes or modifications made in accordance to the spirit and essence of the present invention shall fall into the protection scope of the present invention.

The invention claimed is:

1. A graphene transistor optical detector based on a metamaterial structure, comprising:
    a substrate:
    a gate metal layer disposed above the substrate;
    a gate medium layer disposed above the gate metal layer;
    a graphene layer disposed above the gate medium layer;
    a source metal layer with a first plurality of orthogonal protrusions disposed above the graphene layer;
    a drain metal layer with a second plurality of orthogonal protrusions disposed above the graphene layer and away from the first plurality of orthogonal protrusions,
    wherein the first plurality of orthogonal protrusions and the second plurality of orthogonal protrusions are crossed with each other to form a two-dimensional periodic structure, which together with the graphene layer, the gate metal layer and the gate medium layer to form a metamaterial structure having an absorption characteristic with absorption rates to electromagnetic waves in different polarization directions are same, while orthogonal protrusions of the source metal layer and the drain metal layer on the substrate overlap with orthogonal protrusion of the gate metal layer on the substrate; and
    wherein an impedance Z of the metamaterial structure is equal to or a vacuum impedance of 376.7Ω, wherein $Z=(\mu/\in)^{1/2}$, where $\in$ and $\mu$ denotes a dielectric constant and a magnetic permeability of the metamaterial structure, respectively.

2. The graphene transistor optical detector based on the metamaterial structure according to claim 1, characterized in that a lower end face of the source metal layer and drain metal layer comes into contact with the graphene layer to form a conductive channel for connecting the source metal layer and the drain metal layer of the transistor.

3. The graphene transistor optical detector based on the metamaterial structure according to claim 1, characterized in that t-he a thickness of the source metal layer and drain metal layer is 20-200 nm.

4. The graphene transistor optical detector based on the metamaterial structure according to claim 1, characterized in that a thickness of the gate metal layer is equal to or larger than 50 nm.

5. The graphene transistor optical detector based on the metamaterial structure according to claim 1, characterized in that the gate medium layer is made of low-light-absorption dielectric material including silicon oxide, silicon nitride or aluminum oxide.

6. The graphene transistor optical detector based on the metamaterial structure according to claim 1, characterized in that the graphene layer is selected from single-layer graphene or multi-layer (less than or equal to 10 layers) graphene.

7. An image sensing device or a spectrum detecting and analyzing device, comprising a plurality of the graphene transistor optical detectors based on a metamaterial structure according to claim 1, which are distributed in an array.

\* \* \* \* \*